(12) United States Patent
Chang et al.

(10) Patent No.: US 12,500,159 B2
(45) Date of Patent: Dec. 16, 2025

(54) ELECTRONIC PACKAGE HAVING MULTI-CHIP PACKAGE STRUCTURE

(71) Applicant: SILICONWARE PRECISION INDUSTRIES CO., LTD., Taichung (TW)

(72) Inventors: Li-Chu Chang, Taichung (TW); Yuan-Hung Hsu, Taichung (TW); Don-Son Jiang, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 807 days.

(21) Appl. No.: 17/750,931

(22) Filed: May 23, 2022

(65) Prior Publication Data

US 2023/0268262 A1 Aug. 24, 2023

(30) Foreign Application Priority Data

Feb. 23, 2022 (TW) .................................. 111106567

(51) Int. Cl.
*H01L 23/498* (2006.01)
*H01L 21/48* (2006.01)
*H01L 23/48* (2006.01)
*H01L 25/065* (2023.01)
*H01L 23/00* (2006.01)

(52) U.S. Cl.
CPC .... *H01L 23/49833* (2013.01); *H01L 21/4853* (2013.01); *H01L 21/4857* (2013.01); *H01L 21/486* (2013.01); *H01L 23/481* (2013.01); *H01L 23/49816* (2013.01); *H01L 23/49822* (2013.01); *H01L 23/49838* (2013.01); *H01L 25/0655* (2013.01); *H01L 24/16* (2013.01); *H01L 24/32* (2013.01); *H01L 24/73* (2013.01); *H01L 2224/16227* (2013.01); *H01L 2224/16238* (2013.01); *H01L 2224/32225* (2013.01); *H01L 2224/73204* (2013.01); *H01L 2924/3511* (2013.01); *H01L 2924/37001* (2013.01)

(58) Field of Classification Search
CPC .......... H01L 23/49833; H01L 21/4857; H01L 23/49822; H01L 21/4853; H01L 21/486; H01L 23/481; H01L 23/49816
USPC ........................................................ 257/690
See application file for complete search history.

(56) References Cited

U.S. PATENT DOCUMENTS

2021/0118806 A1* 4/2021 Tai .................... H01L 25/18
2022/0375866 A1* 11/2022 Pietambaram ...... H01L 23/5384
2023/0187422 A1* 6/2023 Lin ..................... H01L 23/3121
257/668

* cited by examiner

*Primary Examiner* — Ratisha Mehta
*Assistant Examiner* — Mikka Liu
(74) *Attorney, Agent, or Firm* — Studebaker Brackett PLLC

(57) ABSTRACT

A method of manufacturing an electronic package is provided and includes disposing a circuit member and a plurality of electronic elements on opposite sides of a carrier structure having circuit layers respectively, so that any two of the plurality of electronic elements can be electrically connected to each other via the circuit layers and the circuit member, where a vertical projected area of the carrier structure is larger than a vertical projected area of the circuit member, such that the circuit member is free from being protruded from side surfaces of the carrier structure. Therefore, the circuit member replaces a part of circuit layers of the carrier structure to reduce the difficulty of fabricating the circuit layers in the carrier structure.

18 Claims, 5 Drawing Sheets

ELECTRONIC PACKAGE HAVING MULTI-CHIP PACKAGE STRUCTURE

BACKGROUND

1. Technical Field

The present disclosure relates to a semiconductor packaging process, and more particularly, to an electronic package and a manufacturing method thereof that can improve yield.

2. Description of Related Art

With the evolution of technology, the demand trend of electronic products is moving towards heterogeneous integration, and for this reason, the multi-chip package structure (MCM/MCP) is gradually emerging.

FIG. 1 is a schematic cross-sectional view of a conventional semiconductor package 1. As shown in FIG. 1, in the semiconductor package 1, a plurality of semiconductor chips 11 are disposed on a fan-out (FO) redistribution layer circuit structure 10 in a flip-chip manner via a plurality of conductive bumps 12. Then, the conductive bumps 12 are covered with an underfill 13, and the semiconductor chips 11 are covered with a packaging layer 18. After that, the circuit structure 10 is disposed on a package substrate 1a via a plurality of solder balls 14, and the solder balls 14 are covered with an encapsulant 15.

The conventional semiconductor package 1 has the functional characteristics of packaging and integrating a plurality of semiconductor chips 11 into one chip, so that the semiconductor package 1 has a larger number of contacts (I/O) and the function of expanding a single chip, which can greatly increase the computing power of the processor to reduce the delay time of signal transmission, so the semiconductor package 1 can be applied to high-end products with high-density lines/high transmission speed/high stack count/large size design.

However, in the conventional semiconductor package 1, as the number of integrated semiconductor chips 11 increases, the number of contacts (I/O) (i.e., the conductive bumps 12) of each of the semiconductor chips 11 will gradually increase, so that the pitch between each of the conductive bumps 12 is getting smaller, so the routing of the fan-out redistribution layer circuit structure 10 for electrically connecting the semiconductor chips 11 needs to be towards the specification of finer line/fine pitch, which greatly increases the manufacturing difficulty, and the requirement for the number of routing layers of the circuit structure 10 also needs to be increased, so that the overall manufacturing cost of the semiconductor package 1 is greatly increased with the increase of the manufacturing cost of the circuit structure 10. As a result, the product yield of the semiconductor package 1 is not high.

Therefore, how to overcome the above-mentioned problems of the prior art has become an urgent issue to be solved at present.

SUMMARY

In view of the above-mentioned various deficiencies of the prior art, the present disclosure provides an electronic package, which includes: a carrier structure having circuit layers and defined with two sides opposite to each other; a circuit member disposed on one of the two sides of the carrier structure and electrically connected to the circuit layers, wherein a vertical projected area of the carrier structure relative to the one of the two sides is greater than a vertical projected area of the circuit member relative to the one of the two sides, such that the circuit member is free from being protruded from side surfaces of the carrier structure connecting the two sides; and a plurality of electronic elements disposed on the other one of the two sides of the carrier structure and electrically connected to the circuit layers, wherein any two of the plurality of electronic elements are electrically connected to each other via the circuit layers and the circuit member.

The present disclosure also provides a method of manufacturing an electronic package, which includes: bonding a carrier structure having circuit layers onto a circuit member, the carrier structure being defined with two sides opposite to each other, wherein a vertical projected area of the carrier structure relative to one of the two sides is greater than a vertical projected area of the circuit member relative to the one of the two sides, such that the circuit member is free from being protruded from side surfaces of the carrier structure connecting the two sides; and disposing a plurality of electronic elements on the other one of the two sides of the carrier structure, wherein the circuit member and the plurality of electronic elements are respectively located on different sides of the carrier structure, and the plurality of electronic elements are electrically connected to the circuit layers, such that any two of the plurality of electronic elements are electrically connected to each other via the circuit layers and the circuit member.

In the aforementioned electronic package and the manufacturing method thereof, the circuit member is a coreless routing structure.

In the aforementioned electronic package and the manufacturing method thereof, a number of layer count of the circuit member is greater than a number of layer count of the circuit layers of the carrier structure.

In the aforementioned electronic package and the manufacturing method thereof, a number of layer count of the circuit member is at least five.

In the aforementioned electronic package and the manufacturing method thereof, the plurality of electronic elements have a plurality of electrode pads, and a position of the circuit member corresponds to a densely distributed area of the electrode pads of the plurality of electronic elements which the circuit member is electrically connected to.

In the aforementioned electronic package and the manufacturing method thereof, a vertical projected area of the circuit member relative to the carrier structure is smaller than a vertical projected area of each of the plurality of electronic elements that is electrically connected to the circuit member relative to the carrier structure.

In the aforementioned electronic package and the manufacturing method thereof, the circuit member overlaps a partial area of each of the plurality of electronic elements that is electrically connected to the circuit member in a vertical direction relative to the carrier structure.

In the aforementioned electronic package and the manufacturing method thereof, the present disclosure further comprises disposing a plurality of conductive pillars on the carrier structure, wherein the plurality of conductive pillars are located around the circuit member and electrically connected to the circuit layers. The present disclosure further comprises firstly covering the circuit member and the plurality of conductive pillars with a cladding layer, and then forming the carrier structure on the cladding layer. Further, the present disclosure further comprises forming a plurality of conductive elements on the cladding layer, wherein the plurality of conductive elements are electrically connected to the plurality of conductive pillars and/or the circuit member.

As can be seen from the above, in the electronic package and the manufacturing method thereof according to the present disclosure, by the design of the circuit member, the routing requirements of arranging high number of circuit layers at a place where the pitch between the electrode pads in any two electronic elements is small Therefore, compared with the prior art, the small-area circuit member according to the present disclosure replaces a portion of the circuit layers of the carrier structure, so as to reduce the difficulty of fabricating the circuit layers on the large-area carrier structure, thereby achieving the purpose of reducing the manufacturing cost and greatly improving the yield.

Furthermore, the present disclosure can avoid the problem of warpage by enhancing the overall structural strength with the cladding layer around the circuit member.

In addition, through the routing design of the circuit member in cooperation with the carrier structure, the number of layer count of the circuit layers of the carrier structure is reduced, thereby effectively reducing the overall manufacturing difficulty and reducing the manufacturing cost.

In addition, the circuit member is electrically connected to the conductive elements, so that the electronic element can transmit signals to the outside via the circuit member, so as to shorten the electrical path and improve the electrical performance of the electronic package.

DETAILED DESCRIPTIONS

The following describes the implementation of the present disclosure by embodiments, and those skilled in the art can easily understand other advantages and effects of the present disclosure from the contents disclosed in this specification.

It should be noted that the structures, proportions, sizes, etc. shown in the accompanying drawings are used for illustrative purposes to facilitate the perusal and comprehension of the contents disclosed in this specification by one skilled in the art, rather than to limit the conditions for practicing the present disclosure. Any modification of the structures, change of the proportion relationships, or adjustment of the sizes without affecting the possible effects and achievable purposes should still be deemed as falling within the scope defined by the technical contents disclosed in the present disclosure. Meanwhile, terms such as "above," "first," "second," "one," etc. used in this specification are merely used for the convenience of description rather than limiting the practicable scope of the present disclosure. Changes or adjustments of the relative relationships thereof without essentially altering the technical content should still be considered in the practicable scope of the present disclosure.

FIG. 2A to FIG. 2G are schematic cross-sectional views illustrating a method of manufacturing an electronic package 2 according to the present disclosure.

Figure 1:
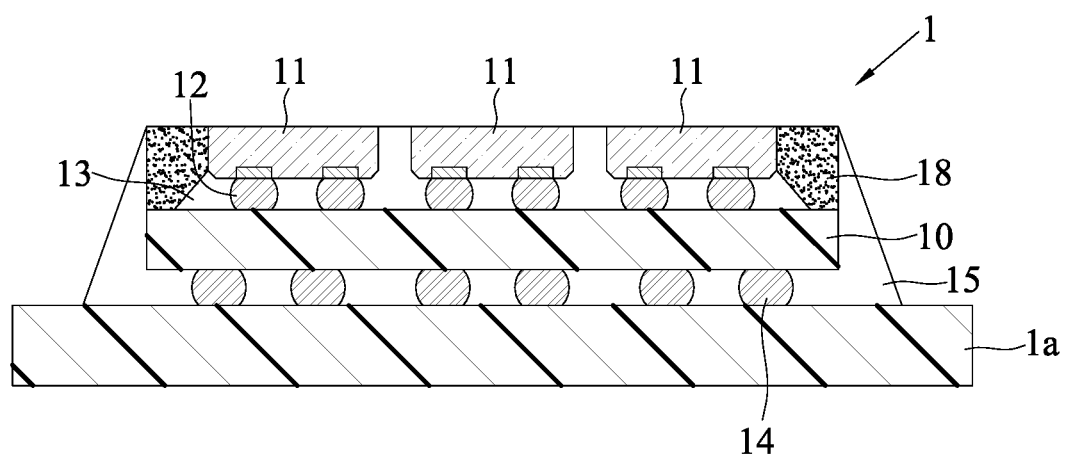
FIG. 1 is a schematic cross-sectional view of a conventional semiconductor package.
Figure 2A:
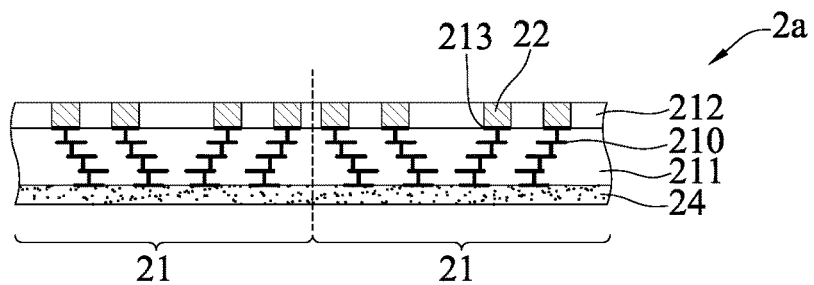
FIG. 2A to FIG. 2G are schematic cross-sectional views illustrating a method of manufacturing an electronic package according to the present disclosure.

As shown in FIG. 2A, a circuit board 2a including a plurality of circuit members 21 is provided, and then the circuit board 2a is cut along a cutting path L to obtain the plurality of circuit members 21.

In an embodiment, the circuit member 21 is a package substrate with a core layer and a routing structure or a coreless routing structure (showing coreless type in the figure). The circuit member 21 has an insulator 211 and a plurality of (the number of layer count in the embodiment is at least five) fan-out type redistribution layers (RDL) 210 bonded with the insulator 211, wherein the material for forming the insulator 211 is a dielectric material such as polybenzoxazole (PBO), polyimide (PI), prepreg (PP), or other dielectric materials. It should be understood that the circuit member 21 can also be other board bodies configured with wiring, such as organic materials, semiconductor materials (silicon), ceramic materials, or other carrier boards with metal routing, and not limited to the above.

Furthermore, one side of the circuit member 21 is bonded with and electrically connected to a plurality of conductors 22, and the conductors 22 are spherical such as solder balls, or pillars of metal materials such as copper pillars, solder bumps, etc., or studs made by wire bonding machines, but are not limited thereto. Further, the conductors 22 are formed on conductive pads 213 of the outermost layer of the redistribution layers 210, and a protective film 212 such as an insulating material can be formed on a surface of the circuit member 21 to cover part of the surfaces of the conductors 22, and end surfaces of the conductors 22 are flush with and exposed from the protective film 212.

Figure 2B:
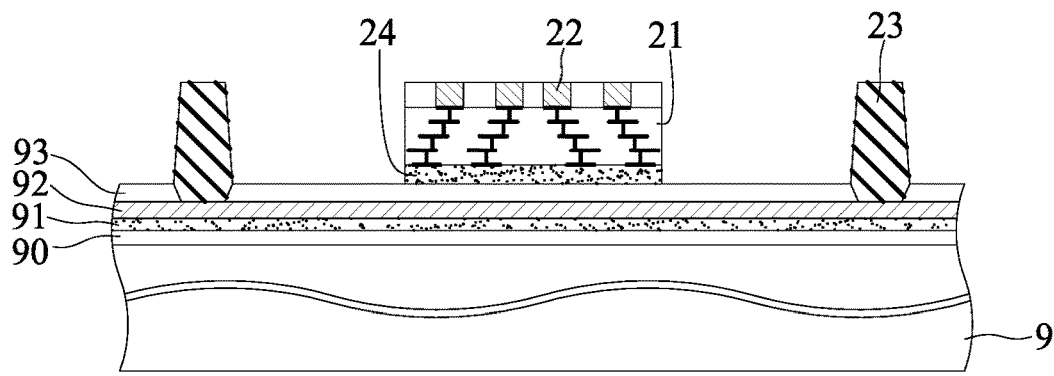

As shown in FIG. 2B, at least one circuit member 21 is arranged on a carrier 9, and a plurality of conductive pillars 23 are formed on the carrier 9, wherein the arrangement sequence of the circuit member 21 and the conductive pillars 23 can be selected according to requirements, and the plurality of conductive pillars 23 are located around the circuit member 21.

In an embodiment, the carrier 9 is, for example, a board body of a semiconductor material (such as silicon or glass), on which a release layer 90, an adhesive layer 91, a metal layer 92 and an insulating layer 93 (e.g., a dielectric material) are sequentially formed by, for instance, coating. For example, the material for forming the insulating layer 93 is a dielectric material such as polybenzoxazole (PBO), polyimide (PI), prepreg (PP), or other dielectric materials.

Furthermore, the material for forming the conductive pillars 23 is a metal material such as copper or a solder material, and the conductive pillars 23 extend and penetrate through the insulating layer 93 to contact the metal layer 92. For example, by exposure and development, a plurality of openings exposing the metal layer 92 are formed on the insulating layer 93, so that the conductive pillars 23 are formed by electroplating on the metal layer 92 from the openings.

In addition, the other side of the circuit member 21 is adhered onto the insulating layer 93 by a bonding layer 24 such as a die attach film (DAF).

Figure 2C:
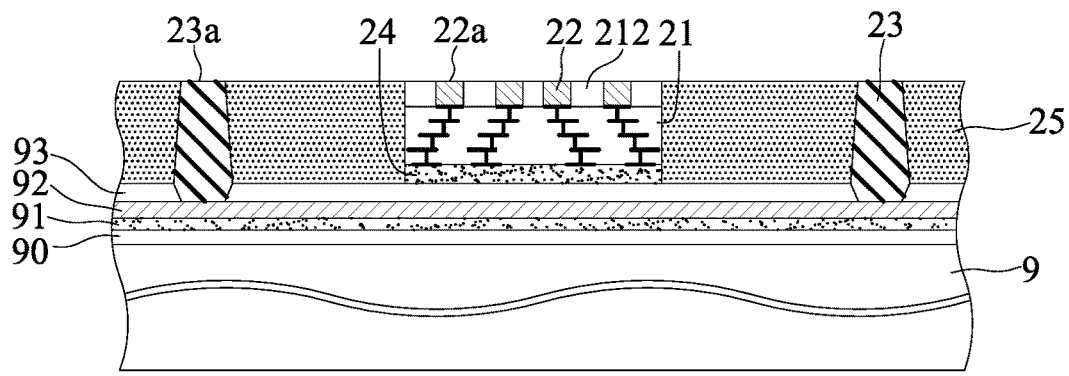

As shown in FIG. 2C, a cladding layer 25 is formed on the insulating layer 93, so that the cladding layer 25 covers the circuit member 21, the bonding layer 24, the protective film 212 and the plurality of conductive pillars 23. Then, through a planarization process, end surfaces 23a of the conductive pillars 23 and end surfaces 22a of the conductors 22 are exposed from the cladding layer 25, so that an outer surface of the cladding layer 25 is flush with the end surfaces 23a of the conductive pillars 23 and the end surfaces 22a of the conductors 22.

In an embodiment, the cladding layer 25 is an insulating material, such as an epoxy resin encapsulant, which can be formed on the carrier 9 by lamination or molding.

Furthermore, the planarization process removes a portion of the conductive pillars 23, a portion of the conductors 22, a portion of the protective film 212 and a portion of the cladding layer 25 by grinding.

Figure 2D:
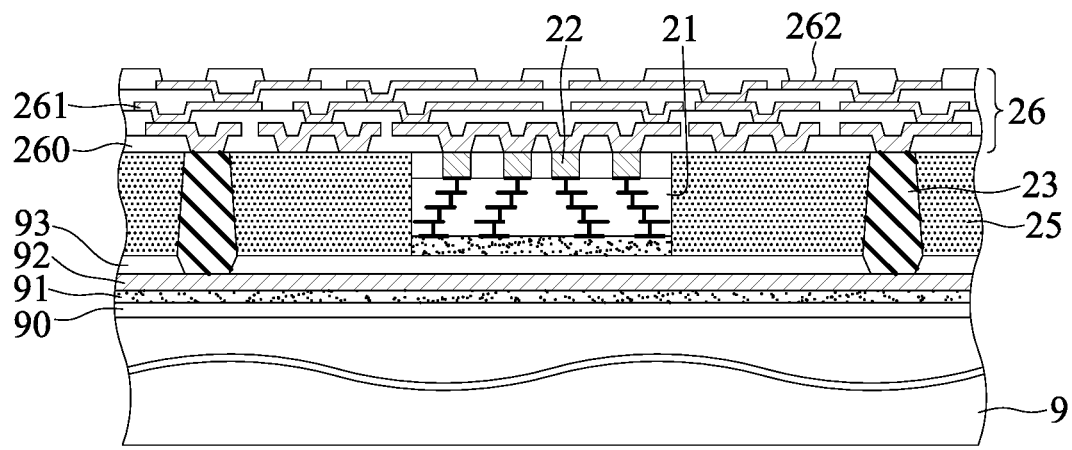

As shown in FIG. 2D, a carrier structure 26 having a circuit layer 261 is formed on the cladding layer 25, and the circuit layer 261 of the carrier structure 26 is electrically connected to the plurality of conductive pillars 23 and the plurality of conductors 22 of the circuit member 21.

In an embodiment, the carrier structure 26 includes a plurality of dielectric layers 260 and a plurality of circuit layers 261 of RDL specification disposed on the dielectric layers 260, and the outermost layer of the dielectric layers 260 can be used as a solder mask layer, and the outermost layer of the circuit layers 261 is exposed from the solder mask layer to serve as conductive pads 262, such as a micro pad (commonly known as µ-pad). Alternatively, the carrier structure 26 may only include a single dielectric layer 260 and a single circuit layer 261. For example, the number of layer count (at least five) of the circuit member 21 is greater than the number of layer count of the circuit layers 261 of the carrier structure 26 (such as three layers as illustrated in the embodiment). Therefore, the number of layer count of the circuit layers 261 having a large area or wafer form can be adjusted by the circuit member 21 having a small area, so that the number of layer count of the circuit layers 261 having a large area can be reduced, so as to improve the yield of the carrier structure 26 having a large area. Furthermore, the material for forming the circuit layer 261 is copper, and the material for forming the dielectric layer 260 is, for example, polybenzoxazole (PBO), polyimide (PI), prepreg (PP), or other dielectric materials, or a solder-proof material such as solder mask, graphite, etc.

Figure 2E:
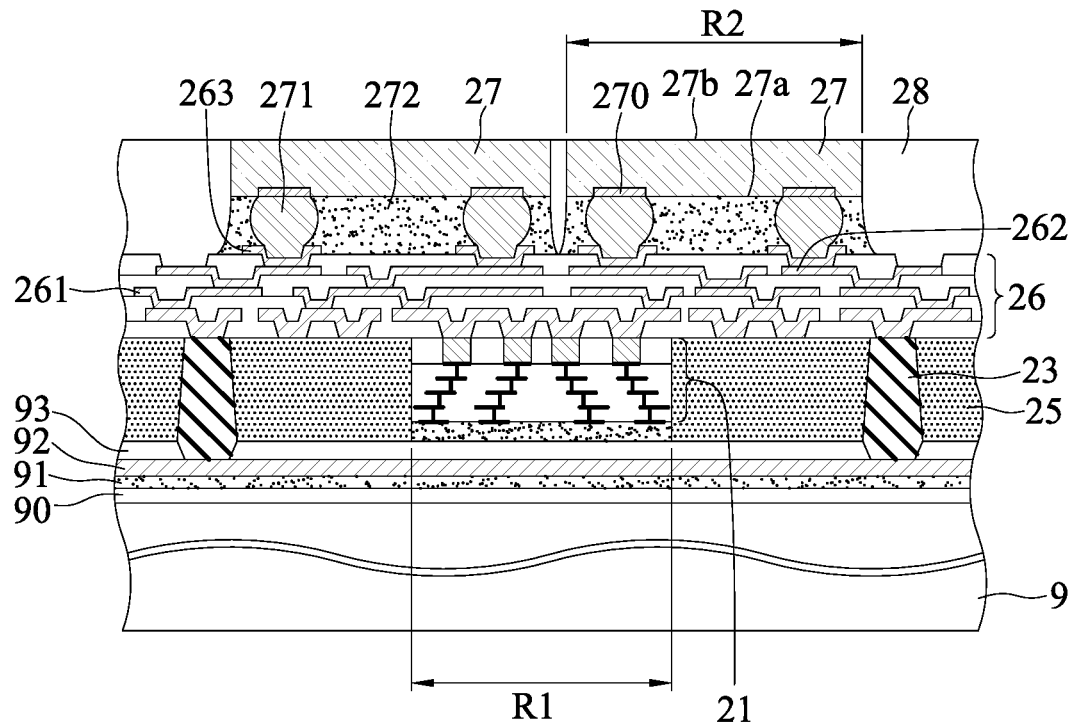

As shown in FIG. 2E, a plurality of electronic elements 27 are disposed on the outermost layer of the circuit layers 261 of the carrier structure 26, and the plurality of electronic elements 27 are electrically connected to the circuit layers 261, so that two of the plurality of electronic elements 27 are electrically connected to each other via the circuit layers 261 and the circuit member 21, that is, the circuit member 21 is electrically bridging two of the plurality of electronic elements 27, wherein a vertical projected area R1 of the circuit member 21 relative to the carrier structure 26 is smaller than a vertical projected area R2 of each of the plurality of electronic elements 27 that is electrically connected to the circuit member 21 relative to the carrier structure 26. After that, the electronic elements 27 are covered by a packaging layer 28.

In an embodiment, the electronic element 27 is an active element, a passive element, or a combination of both, wherein the active element is a semiconductor chip, and the passive element is a resistor, a capacitor, or an inductor. For example, the electronic element 27 is a semiconductor chip, which has an active surface 27a and a non-active surface 27b opposite to each other. The electronic element 27 is disposed on the conductive pads 262 and electrically connected to the circuit layers 261 by the electrode pads 270 of the active surface 27a via a plurality of conductive bumps 271 such as solder material in a flip-chip manner, and an Under Bump Metallurgy (UBM) layer 263 can be formed on the conductive pads 262 to facilitate the bonding of the conductive bumps 271; alternatively, the electronic element 27 is disposed on the carrier structure 26 by its non-active surface 27b, and can be electrically connected to the conductive pads 262 via a plurality of bonding wires (not shown) in a wire bonding manner; alternatively, the electronic element 27 is electrically connected to the circuit layers 261 via conductive materials (not shown) such as conductive glue or solder. However, the manner in which the electronic element 27 is electrically connected to the circuit layers 261 is not limited to the above.

Moreover, the packaging layer 28 is an insulating material, such as polyimide (PI), dry film, encapsulant such as epoxy resin, or molding compound, which can be formed on the carrier structure 26 by lamination or molding. It should be understood that the materials for forming the cladding layer 25 and the packaging layer 28 may be the same or different.

In addition, the packaging layer 28 can directly cover the conductive bumps 271; or, an underfill 272 can be first formed between the electronic element 27 and the carrier structure 26 to cover the conductive bumps 271, and then the packaging layer 28 is formed to cover the underfill 272 and the electronic element 27.

Figure 2F:
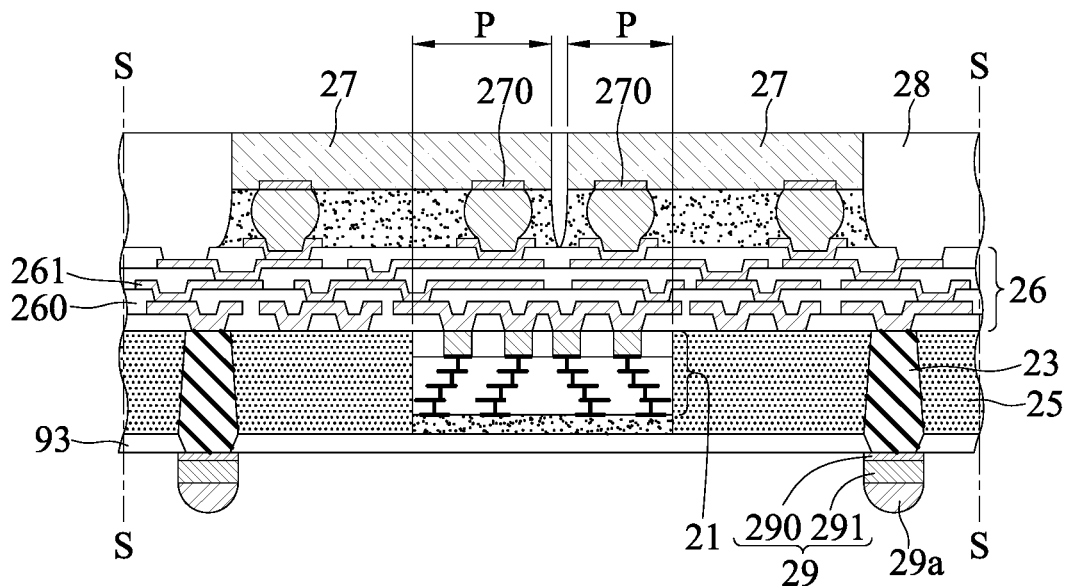

As shown in FIG. 2F, the carrier 9 and the release layer 90 thereon are peeled off, and then the adhesive layer 91 and the metal layer 92 are removed by etching, so that the plurality of conductive pillars 23 are exposed from the insulating layer 93 for arranging a plurality of conductive elements 29 on the plurality of conductive pillars 23, so that the plurality of conductive elements 29 are electrically connected to the plurality of conductive pillars 23, wherein the conductive elements 29 include a pad-shaped metal body (e.g., UBM) 290 formed on the insulating layer 93 to contact the plurality of conductive pillars 23, and a plurality of copper pillars 291 bonded with the metal body 290, so that solder materials 29a such as solder bumps or solder balls are formed on end surfaces of the copper pillars 291.

In an embodiment, the position of the circuit member 21 corresponds to a densely distributed area P of the electrode pads 270 of the plurality of electronic elements 27 which the circuit member 21 is electrically connected to, so that the line width of the redistribution layer 210 of the circuit member 21 is less than 2 microns. For example, the routing specification of the circuit member 21 is a line width/line spacing (L/S) of at most 2 µm (i.e., L/S≤2/2 µm), and a place where the number of electrode pads 270 serving as contacts (I/O) of the electronic element 27 is large and dense is defined as a densely distributed area P, and the electrode pads 270 of the densely distributed area P are electrically connected to the circuit member 21.

Furthermore, the circuit member 21 overlaps a partial area of each of the plurality of electronic elements 27 that is electrically connected to the circuit member 21 in a vertical direction relative to the carrier structure 26. For example, the circuit member 21 overlaps the partial area of the electronic element 27 that it is electrically bridged, so that the position of the circuit member 21 relative to the electronic element 27 can be correspondingly overlapped on the densely distributed area P of the electrode pads 270 of the electronic element 27.

Figure 2G:
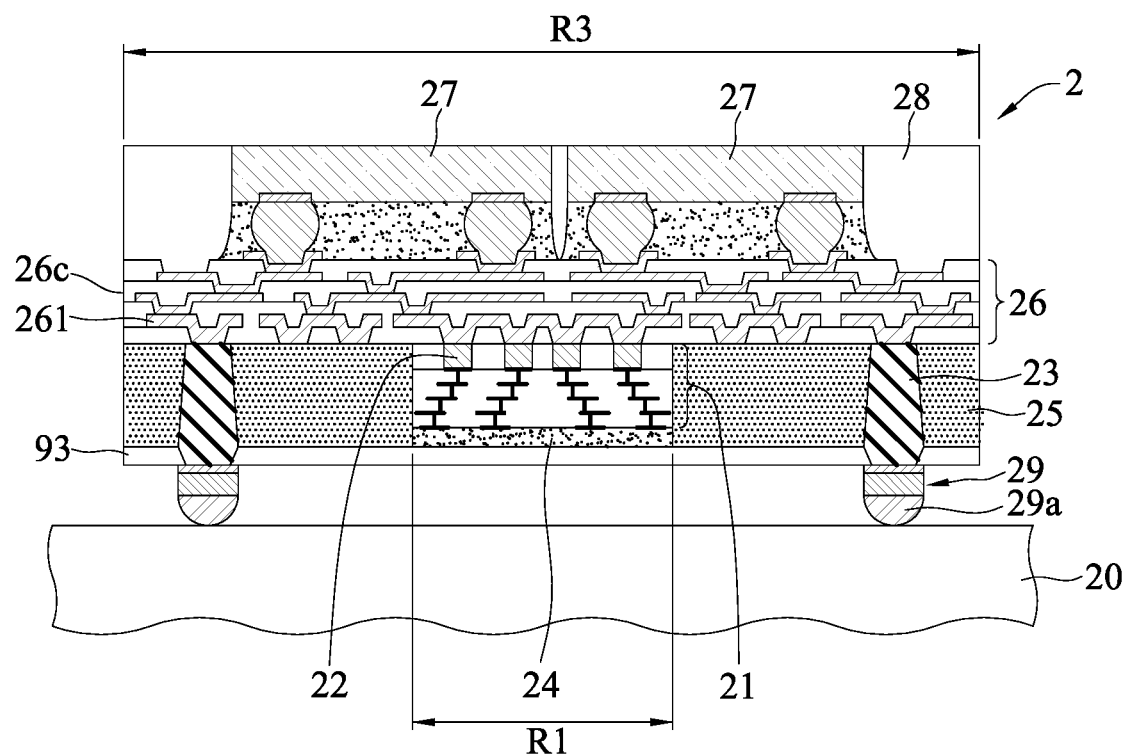

As shown in FIG. 2G, a singulation process is performed along a cutting path S shown in FIG. 2F to form an electronic package 2, and in the subsequent process, the electronic package 2 can be disposed onto an electronic device 20 such as a package substrate or a circuit board via the conductive elements 29.

In an embodiment, a vertical projected area R3 of the carrier structure 26 is greater than the vertical projected area R1 of the circuit member 21 (or any one of the circuit members 21), and the circuit member 21 (or any one of the circuit members 21) is free from being protruded from side surfaces 26c of the carrier structure 26.

Therefore, in the manufacturing method of the present disclosure, through the fine line design of the circuit member 21, the contacts (I/O) (i.e., the electrode pads 270 of the densely distributed area P) with smaller pitches in the electronic elements 27 can be used as paths for the electronic elements 27 to be electrically connected to each other via the circuit member 21 and the carrier structure 26, so as to meet the routing requirements of arranging a RDL structure with large number of layers (such as five layer counts of the circuit member 21) at a place where the pitch between the electrode pads 270 in any two electronic elements 27 is small. Therefore, compared with the design of the electrical conduction of the fan-out redistribution layer which needs to be laid on the entire surface at one time in the prior art, in the manufacturing method of the present disclosure, the small-area circuit member 21 replaces a portion of the circuit layer 261 of the large-area carrier structure 26, so as to reduce the number of RDL routing layers of the large-area circuit layer 261 for arranging the densely distributed area P. Thus, the manufacturing difficulty is reduced, and the purpose of reducing the manufacturing cost and greatly improving the yield can be achieved.

In addition, the adjustable size of the circuit member 21 can balance the stress distribution of the electronic package 2. Therefore, compared with the prior art, the present disclosure uses the circuit member 21 as the partial RDL specification to adjust the size of the circuit member 21 according to the degree of warpage of the structure requirements when cutting the circuit board 2a. Thus, when the area of the electronic package 2 is of large size specification, the degree of warpage of the electronic package 2 can be significantly improved to enhance the reliability of the electronic package 2. In addition, in order to further improve the reliability of the electronic package 2, the overall structural strength can be enhanced with a higher strength material (i.e., the cladding layer 25) around the circuit member 21 to further reduce the risk of warpage.

In addition, since the contacts (i.e., the electrode pads 270 in areas other than the densely distributed area P) with larger pitches in the electronic elements 27 only require a low number of layers of routing, electrical transmission can be performed via the carrier structure 26 and the conductive pillars 23. Therefore, the manufacturing method of the present disclosure employs a routing design in which a partial high number of layer count (the circuit member 21) is cooperated with a partial low number of layer count (the carrier structure 26) (that is, the circuit member 21 replaces a portion of the RDL circuit layers 261 of the carrier structure 26), so that the carrier structure 26 can not only maintain the circuit layers 261 of the large-scale L/S with high yield (for example, the L/S is 10/10 microns), but also can reduce the number of layer count of the circuit layers 261 (for example, less than five layers of the circuit layers 261) to improve the process yield of the carrier structure 26 (or RDL), thereby effectively reducing the overall process difficulty (or effectively improving the overall yield) and reducing the manufacturing cost.

Figure 3:
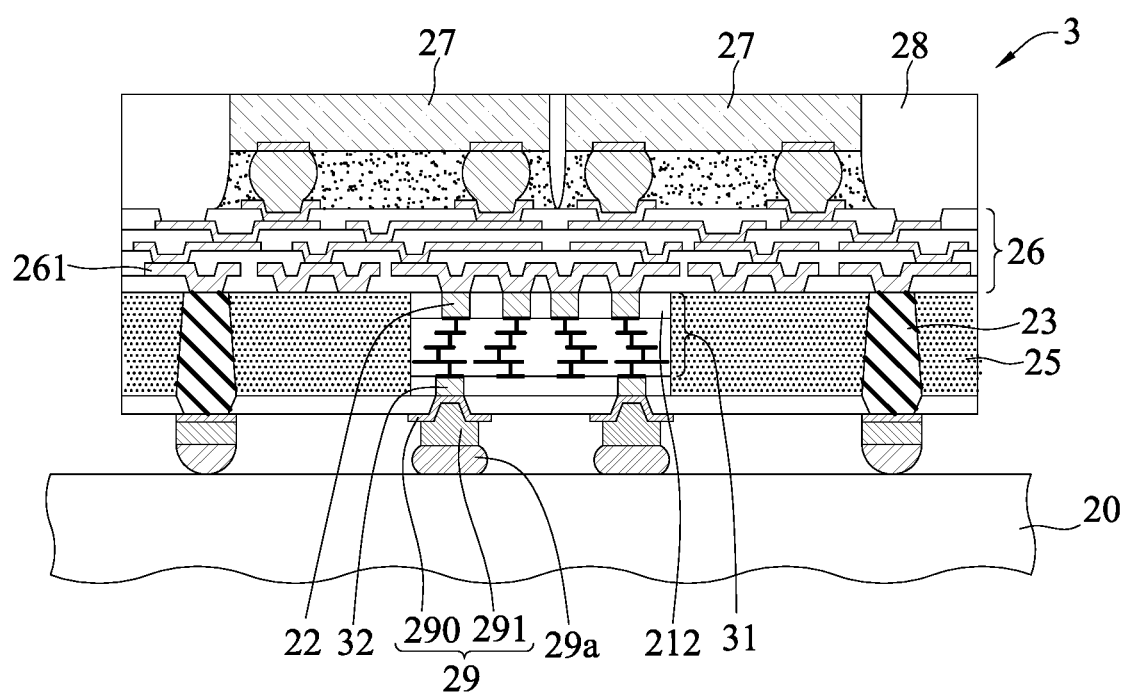
FIG. 3 is a schematic cross-sectional view showing another embodiment of FIG. 2G.

In another embodiment, in an electronic package 3 shown in FIG. 3, opposite sides of a circuit member 31 are bonded and electrically connected to a plurality of conductors 22, 32, and a protective film 212 is formed on one side of the circuit member 31, so that the protective film 212 covers the conductors 22, and a bonding layer 34 such as a non-conductive film (NCF) is formed on the other side of the circuit member 31, so that the bonding layer 34 covers the conductors 32. Therefore, after removing the carrier 9 and the release layer 90, the adhesive layer 91 and the metal layer 92 thereon, the insulating layer 93 is subjected to an opening process by laser to expose the conductors 32 from the openings of the insulating layer 93, and a plurality of conductive elements 29 can be arranged on the conductors 32 of the circuit member 31 and a plurality of conductive pillars 23, so that the plurality of conductive elements 29 are electrically connected to the plurality of conductive pillars 23 and the circuit member 31, wherein a portion of the metal body 290 may be formed in the openings to contact the conductors 32.

Therefore, the circuit member 31 can be designed to have external contacts on opposite sides, so that the circuit member 31 is electrically connected to the conductive elements 29, so that a portion of the electrical path of the electronic element 27 (i.e., the electrode pads 270 in areas other than the densely distributed area P, such as the power signal port) can also be directly transmitted up and down to the electronic device 20 via the circuit member 31 so as to shorten the electrical path and improve the electrical performance.

The present disclosure also provides an electronic package 2, 3, comprising: a carrier structure 26 having circuit layers 261, a circuit member 21, 31 and a plurality of electronic elements 27.

The carrier structure 26 is defined with two sides opposite to each other.

The circuit member 21, 31 is disposed on one of the two sides of the carrier structure 26 and electrically connected to the circuit layers 261, wherein a vertical projected area R3 of the carrier structure 26 relative to the one of the two sides is larger than a vertical projected area R1 of the circuit member 21, 31 relative to the one of the two sides, and the circuit member 21, 31 is free from being protruded from side surfaces 26c of the carrier structure 26 connecting the two sides.

The electronic elements 27 are disposed on the other one of the two sides of the carrier structure 26 and are electrically connected to the circuit layers 261, so that any two of the plurality of electronic elements 27 are electrically connected to each other via the circuit layers 261 and the circuit member 21, 31.

In one embodiment, the circuit member 21, 31 is a routing structure without a core layer.

In one embodiment, the number of layer count of the circuit member 21, 31 is greater than the number of layer count of the circuit layers 261 of the carrier structure 26.

In one embodiment, the number of the layer count of the circuit member 21, 31 is at least five.

In one embodiment, the plurality of electronic elements 27 have a plurality of electrode pads 270, and the position of the circuit member 21, 31 corresponds to the densely distributed area P of the electrode pads 270 of the plurality of electronic elements 27 which the circuit member 21, 31 is electrically connected to.

In one embodiment, a vertical projected area R1 of the circuit member 21, 31 relative to the carrier structure 26 is smaller than a vertical projected area R2 of each electronic element 27 of the plurality of electronic elements 27 that is electrically connected to the circuit member 21, 31 relative to the carrier structure 26.

In one embodiment, the circuit member 21, 31 overlaps a partial area of each electronic element 27 of the plurality of electronic elements 27 that is electrically connected to the circuit member 21, 31 in a vertical direction relative to the carrier structure 26.

In one embodiment, the electronic package 2, 3 further includes a plurality of conductive pillars 23 disposed on the carrier structure 26, the conductive pillars 23 are disposed around the circuit member 21, 31 and electrically connected to the circuit layers 261. Further, the electronic package 2, 3 further includes a cladding layer 25 covering the circuit member 21, 31 and the plurality of conductive pillars 23, and the carrier structure 26 is bonded with the cladding layer 25. For example, a plurality of conductive elements 29 electrically connected to the conductive pillars 23 and/or the circuit member 31 are formed on the cladding layer 25.

To sum up, in the electronic package and the manufacturing method thereof according to the present disclosure, the fine line design of the circuit member is used to meet the routing requirements of arranging the RDL structure with large number of layers at a place where the pitch between the electrode pads in any two electronic elements is small. Therefore, the present disclosure replaces a portion of the circuit layers of the large-area carrier structure with the small-area circuit member, so as to reduce the difficulty of fabricating the circuit layers of the large-area carrier structure, thereby achieving the purpose of reducing manufacturing cost and greatly improving yield.

Furthermore, by filling the cladding layer around the circuit member, the overall structural strength can be enhanced and the problem of warpage can be avoided.

In addition, the present disclosure employs a routing design in which a partial high number of layer count (that is, the circuit member) is cooperated with a partial low number of layer count (that is, the carrier structure) to reduce the number of layer count of the circuit layers of the carrier structure, thereby reducing the overall process difficulty and the production costs.

In addition, by further designing the circuit member as an electrical transmission path that is conducted up and down to electrically connect (or connect in series) the electronic element and the conductive elements, the electronic element can transmit signals to the outside via the circuit member so as to shorten the electrical path, so that the electrical performance of the electronic package can be improved.

The above-mentioned embodiments are utilized to illustrate the principles and effects of the present disclosure, but not to limit the present disclosure. Any person skilled in the art can make modifications to the above embodiments without departing from the spirit and scope of the present disclosure. Accordingly, the scope of protection with regard to present disclosure should be as defined in the appended claims listed below.

What is claimed is:

1. An electronic package, comprising:
a carrier structure having circuit layers and defined with two sides opposite to each other;
a circuit member disposed on one of the two sides of the carrier structure and electrically connected to the circuit layers, wherein a vertical projected area of the carrier structure relative to the one of the two sides is greater than a vertical projected area of the circuit member relative to the one of the two sides, such that the circuit member is free from being protruded from side surfaces of the carrier structure connecting the two sides, and wherein the circuit member is a coreless routing structure; and
a plurality of electronic elements disposed on the other one of the two sides of the carrier structure and electrically connected to the circuit layers, wherein any two of the plurality of electronic elements are electrically connected to each other via the circuit layers and the circuit member.

2. The electronic package of claim 1, wherein a number of layer count of the circuit member is greater than a number of layer count of the circuit layers of the carrier structure.

3. The electronic package of claim 1, wherein a number of layer count of the circuit member is at least five.

4. The electronic package of claim 1, wherein the plurality of electronic elements have a plurality of electrode pads, and a position of the circuit member corresponds to a densely distributed area of the electrode pads of the plurality of electronic elements which the circuit member is electrically connected to.

5. The electronic package of claim 1, wherein a vertical projected area of the circuit member relative to the carrier structure is smaller than a vertical projected area of each of the plurality of electronic elements that is electrically connected to the circuit member relative to the carrier structure.

6. The electronic package of claim 1, wherein the circuit member overlaps a partial area of each of the plurality of electronic elements that is electrically connected to the circuit member in a vertical direction relative to the carrier structure.

7. The electronic package of claim 1, further comprising a plurality of conductive pillars disposed on the carrier structure, wherein the plurality of conductive pillars are disposed around the circuit member and electrically connected to the circuit layers.

8. The electronic package of claim 7, further comprising a cladding layer bonded to the carrier structure and covering the circuit member and the plurality of conductive pillars.

9. The electronic package of claim 8, further comprising a plurality of conductive elements formed on the cladding layer and electrically connected to the plurality of conductive pillars and/or the circuit member.

10. A method of manufacturing an electronic package, comprising:
bonding a carrier structure having circuit layers onto a circuit member, the carrier structure being defined with two sides opposite to each other, wherein the circuit member is disposed on one of the two sides of the carrier structure and electrically connected to the circuit layers, wherein a vertical projected area of the carrier structure relative to the one of the two sides is greater than a vertical projected area of the circuit member relative to the one of the two sides, such that the circuit member is free from being protruded from side surfaces of the carrier structure connecting the two sides, and wherein the circuit member is a coreless routing structure; and
disposing a plurality of electronic elements on the other one of the two sides of the carrier structure, wherein the plurality of electronic elements are electrically connected to the circuit layers, such that any two of the plurality of electronic elements are electrically connected to each other via the circuit layers and the circuit member.

11. The method of claim 10, wherein a number of layer count of the circuit member is greater than a number of layer count of the circuit layers of the carrier structure.

12. The method of claim 10, wherein a number of layer count of the circuit member is at least five.

13. The method of claim 10, wherein the plurality of electronic elements have a plurality of electrode pads, and a position of the circuit member corresponds to a densely distributed area of the electrode pads of the plurality of electronic elements which the circuit member is electrically connected to.

14. The method of claim 10, wherein a vertical projected area of the circuit member relative to the carrier structure is smaller than a vertical projected area of each of the plurality of electronic elements that is electrically connected to the circuit member relative to the carrier structure.

15. The method of claim 10, wherein the circuit member overlaps a partial area of each of the plurality of electronic elements that is electrically connected to the circuit member in a vertical direction relative to the carrier structure.

16. The method of claim 10, further comprising disposing a plurality of conductive pillars around the circuit member, wherein the plurality of conductive pillars are electrically connected to the circuit layers of the carrier structure.

17. The method of claim 16, further comprising firstly covering the circuit member and the plurality of conductive pillars with a cladding layer, and then forming the carrier structure on the cladding layer.

18. The method of claim 17, further comprising forming a plurality of conductive elements on the cladding layer, wherein the plurality of conductive elements are electrically connected to the plurality of conductive pillars and/or the circuit member.

\* \* \* \* \*